US012631341B2

(12) United States Patent
Jeong et al.

(10) Patent No.: US 12,631,341 B2
(45) Date of Patent: May 19, 2026

(54) COOKING APPLIANCE

(71) Applicant: Samsung Electronics Co., Ltd.,
Suwon-si (KR)

(72) Inventors: Jiho Jeong, Suwon-si (KR); Sangjun Park, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 500 days.

(21) Appl. No.: 18/066,177

(22) Filed: Dec. 14, 2022

(65) Prior Publication Data

US 2023/0119872 A1 Apr. 20, 2023

Related U.S. Application Data

(63) Continuation of application No. PCT/KR2021/008033, filed on Jun. 25, 2021.

(30) Foreign Application Priority Data

Jul. 7, 2020 (KR) ........................ 10-2020-0083651

(51) Int. Cl.
| | |
|---|---|
| *F24C 15/02* | (2006.01) |
| *F24C 7/08* | (2006.01) |
| *H05B 6/64* | (2006.01) |
| *H05K 7/14* | (2006.01) |

(52) U.S. Cl.
CPC .............. *F24C 15/02* (2013.01); *F24C 7/085* (2013.01); *H05B 6/6414* (2013.01); *H05K 7/1402* (2013.01); *H05K 7/1427* (2013.01)

(58) Field of Classification Search
CPC ........ F24C 15/02; F24C 15/04; F24C 15/045; H05K 7/1427; H05K 7/1402; H05B 6/6482; H05B 6/763; H05B 6/6414
See application file for complete search history.

(56) References Cited

U.S. PATENT DOCUMENTS

| | | | |
|---|---|---|---|
| 6,515,266 B2 | 2/2003 | Nasu et al. |
| 7,375,310 B2 | 5/2008 | Oh et al. |
| 8,769,879 B2 | 7/2014 | Lee et al. |
| (Continued) | | | |

FOREIGN PATENT DOCUMENTS

| | | |
|---|---|---|
| CN | 1309266 A | 8/2001 |
| EP | 1120606 A2 | 8/2001 |
| (Continued) | | |

OTHER PUBLICATIONS

KR 100369820 with Machine Translation (Year: 2003).*

(Continued)

*Primary Examiner* — Allen R. B. Schult
*Assistant Examiner* — Amy E Carter

(57) ABSTRACT

A cooking appliance according to a concept of the disclosure includes: a cooking room; and a door configured to open or close the cooking room, wherein the door includes: a door body forming an accommodating space in which a printed circuit board is accommodated; a front panel positioned in front of the door body to cover the accommodating space; and a panel bracket fixed to the front panel and configured to detachably couple the front panel with the door body, and the accommodating space is exposed to an outside of the cooking appliance upon separating of the front panel from the door body.

20 Claims, 14 Drawing Sheets

(56)                References Cited

U.S. PATENT DOCUMENTS

| | | | | | |
|---|---|---|---|---|---|
| 8,960,934 | B2 * | 2/2015 | Sung | ..................... | F25D 23/028 |
| | | | | | 362/218 |
| 10,852,864 | B2 | 12/2020 | Park et al. | | |
| 11,056,051 | B2 | 7/2021 | Kim et al. | | |
| 11,181,317 | B2 | 11/2021 | Park | | |
| 2001/0009256 | A1 * | 7/2001 | Nasu | ..................... | H05B 6/763 |
| | | | | | 219/739 |
| 2008/0148963 | A1 * | 6/2008 | Kim | ..................... | F24C 15/006 |
| | | | | | 99/341 |
| 2016/0117022 | A1 * | 4/2016 | Kim | ..................... | F24C 15/02 |
| | | | | | 345/82 |
| 2020/0149746 | A1 | 5/2020 | Lee et al. | | |

FOREIGN PATENT DOCUMENTS

| | | | | | |
|---|---|---|---|---|---|
| EP | 3582397 | A1 | | 12/2019 | |
| JP | 2007-327675 | A | | 12/2007 | |
| KR | 20-0152027 | Y1 | | 7/1999 | |
| KR | 10-2001-0029177 | A | | 4/2001 | |
| KR | 10-2001-0081463 | A | | 8/2001 | |
| KR | 100369820 | B1 | * | 1/2003 | |
| KR | 100385188 | B1 | * | 5/2003 | ........... H05B 6/6414 |
| KR | 10-0498537 | B1 | | 7/2005 | |
| KR | 10-0560206 | B1 | | 3/2006 | |
| KR | 10-0811304 | B1 | | 3/2008 | |
| KR | 10-1025643 | B1 | | 3/2011 | |
| KR | 10-1174917 | B1 | | 8/2012 | |
| KR | 10-1330106 | B1 | | 11/2013 | |
| KR | 10-2016-0048587 | A | | 5/2016 | |
| KR | 10-1668921 | B1 | | 10/2016 | |
| KR | 10-2018-0121252 | A | | 11/2018 | |
| KR | 10-1993004 | B1 | | 6/2019 | |
| WO | WO-2018199531 | A1 | * | 11/2018 | .............. F24C 15/04 |

OTHER PUBLICATIONS

KR 100385188 with Machine Translation (Year: 2003).*
Machine Translation of WO 2018199531 (Year: 2018).*
Supplementary European Search Report dated Oct. 13, 2023, in connection with European Application No. 21838309.9, 8 pages.
Notice of Preliminary Rejection dated Oct. 18, 2024, in connection with Korean Application No. 10-2020-0083651, 18 pages.
International Search Report and Written Opinion of the International Searching Authority dated Oct. 14, 2021, in connection with International Application No. PCT/KR2021/008033, 10 pages.
Office Action issued Jun. 20, 2025, in connection with Korean Patent Application No. 10-2020-0083651, 7 pages.
Notification of the First Office Action dated Oct. 11, 2025, in connection with Chinese Application No. 202180049731.3, 14 pages.
Notification of the Second Office Action dated Feb. 3, 2026, in connection with Chinese Application No. 202180049731.3, 11 pages.

* cited by examiner

COOKING APPLIANCE

CROSS-REFERENCE TO RELATED APPLICATIONS

This application is a continuation application, under 35 U.S.C. § 111(a), of international application No. PCT/KR2021/008033, filed on Jun. 25, 2021, which claims priority to Korean Patent Application No. 10-2020-0083651, filed on Jul. 7, 2020 in the Korean Intellectual Property Office, the disclosures of which are incorporated by reference herein in entirety.

BACKGROUND

1. Field

The present disclosure relates to a cooking appliance, and more particularly, to a cooking appliance having an improved door assembly structure.

2. Description of Related Art

A cooking appliance is an appliance for cooking a to-be-cooked material such as food by heating the to-be-cooked material, and provides various functions related to cooking, such as heating, defrosting, drying, and sterilizing of a to-be-cooked material.

Examples of the cooking appliance are an oven including a gas oven, an electric oven, etc., a microwave heating device (hereinafter, referred to as a microwave), a gas range, an electric range, a gas grill, and an electric grill.

In general, the oven is an appliance for cooking food by transferring heat directly to the food or heating the inside of the cooking room through a heating source such as a heater for generating heat, and the microwave is an appliance for cooking food with intermolecular friction heat generated by disturbing the molecular arrangement of the food using high frequency as a heating source.

An aspect of the disclosure provides a cooking appliance allowing easy access to a printed circuit board installed in a door.

Another aspect of the disclosure provides a cooking appliance capable of easily changing a design of a door.

SUMMARY

A cooking appliance according to a concept of the present disclosure includes: a cooking room; and a door configured to open or close the cooking room, wherein the door includes: a door body forming an accommodating space in which a printed circuit board is accommodated; a front panel positioned in front of the door body to cover the accommodating space; and a panel bracket fixed to the front panel and configured to detachably couple the front panel with the door body, and the accommodating space is exposed to an outside of the cooking apparatus upon separating of the front panel from the door body.

The panel bracket may include: a bracket body fixed to a rear surface of the front panel; and a coupling protrusion protruding from the bracket body and coupled with the door body, and the door body may include a coupling hole in which the coupling protrusion is inserted.

The coupling protrusion may be inserted in the coupling hole in a first direction, and the coupling protrusion inserted in the coupling hole may be coupled with the door body by sliding in a second direction that is perpendicular to the first direction.

The coupling protrusion may include: a protrusion portion protruding from the bracket body in the first direction; and a hook portion extending from one end of the protrusion portion in the second direction.

The door body may include a coupling jaw forming a portion of the coupling hole, and according to sliding of the coupling protrusion, the coupling jaw may be inserted in a separation space formed by the coupling protrusion.

The coupling protrusion may be in a shape of a bent panel, and form a coupling space opening in the second direction.

The door body may include a guide protrusion corresponding to the coupling space and formed between a pair of guide grooves extending from the coupling hole, and according to sliding of the coupling protrusion, the guide protrusion may be configured to insert in the coupling protrusion, and the coupling protrusion may be configured to insert in the pair of guide grooves.

The panel bracket may include a coupling flange bent from a lower end, and the door body may include a coupling groove that corresponds to the coupling flange and in which the coupling flange is inserted.

The panel bracket may be coupled with the door body by a coupling member penetrating a bottom of the door body and the coupling flange.

The door body may include a recess opening toward the front direction and forming the accommodating space, and the door may further include a board case accommodated in the recess and configured to receive the printed circuit board.

The board case may be fixed to the panel bracket by a coupling member, and upon coupling of the panel bracket with the door body, the board case may be accommodated in the recess.

The panel bracket may include a fixing rail protruding from a rear surface of the bracket body to support a side portion of the board case, and the coupling member may be coupled with the board case by penetrating the fixing rail.

The board case may be fixed to the door body by a coupling member, in a state of inserting into the recess.

The front panel may include an input electrically connected with the printed circuit board.

The input may be electrically connected with the printed circuit board by a connector, the panel bracket may include an incision portion that the connector penetrates, and the board case may be positioned at a location corresponding to the incision portion.

In another aspect, a cooking appliance according to a concept of the present disclosure includes: a housing; a door body rotatably coupled with the housing; a front panel positioned in front of the door body and forming an front of the cooking appliance; and a panel bracket of which a first side is fixed to the font panel to detachably couple the front panel with the door body and a second side configured to hook-couple with the door body.

The panel bracket may include a coupling protrusion coupled with the door body and including a protrusion portion protruding toward the door body and a hook portion bent from an end of the protrusion portion in a horizontal direction.

The panel bracket may slide in a horizontal direction with respect to the door body, and the front panel may slide together with the panel bracket.

The cooking appliance according to a concept of the present disclosure further includes a board case that is installed in the door body, which opens towards the front panel, and is configured to accommodate a printed circuit board.

The front panel may cover the board case in a front direction.

Because a door panel covers an accommodating space of a door body in which a printed circuit board is accommodated and slides with respect to the door body to be coupled with or separated from the door body, a user may easily separate the door panel and access the accommodating space and the printed circuit board to manufacture and repair a door.

Because a front panel of the door panel constitutes an appearance of the door and a user may easily install or separate the door panel, it may be possible to easily change a design of the door by replacing the door panel with different designs of door panels.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
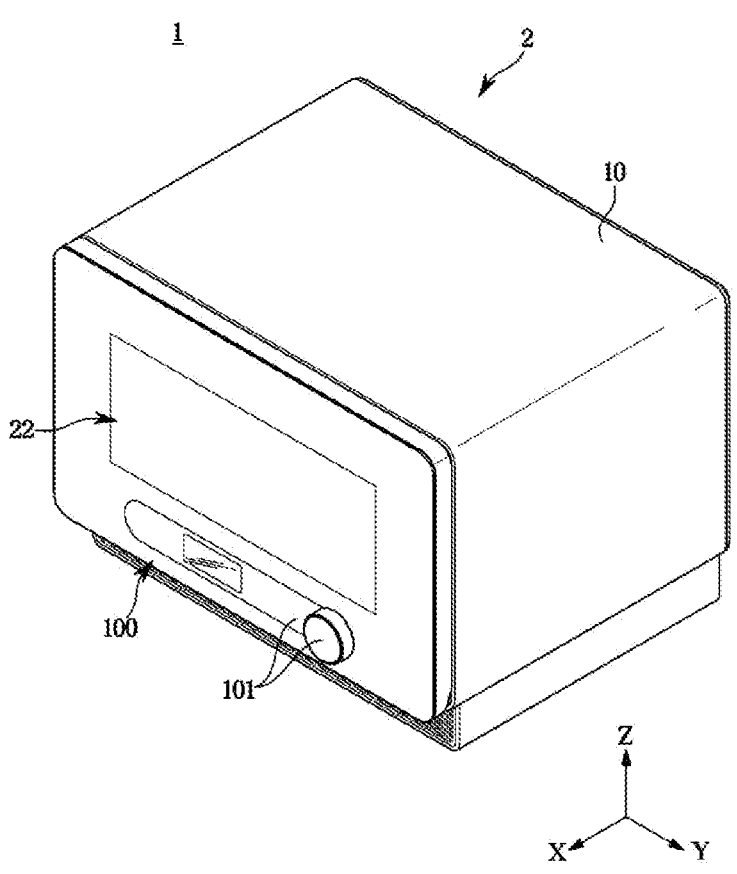
FIG. 1 is a perspective view of a cooking appliance according to various embodiments of the disclosure.

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Configurations illustrated in the embodiments and the drawings described in the present specification are only the preferred embodiments of the present disclosure, and thus it is to be understood that various modified examples, which may replace the embodiments and the drawings described in the present specification, are possible when filing the present application.

Also, like reference numerals or symbols denoted in the drawings of the present specification represent members or components that perform the substantially same functions.

Also, the terms used in the present specification are merely used to describe the embodiments, and are not intended to limit and/or restrict the disclosure. It is to be understood that the singular forms "a," "an," and "the" include plural referents unless the context clearly dictates otherwise.

It will be understood that when the terms "includes," "comprises," "including," and/or "comprising," when used in this specification, specify the presence of stated features, figures, steps, operations, components, members, or combinations thereof, but do not preclude the presence or addition of one or more other features, figures, steps, operations, components, members, or combinations thereof.

Also, it will be understood that, although the terms including ordinal numbers, such as "first", "second", etc., may be used herein to describe various components, these components should not be limited by these terms. These terms are only used to distinguish one component from another.

For example, a first component could be termed a second component, and, similarly, a second component could be termed a first component, without departing from the scope of the present disclosure. As used herein, the term "and/or" includes any and all combinations of one or more of associated listed items.

Meanwhile, in the following description, the terms "front", "rear", "upper", and "lower" are defined based on the drawings, and the shapes and positions of the components are not limited by the terms.

Hereinafter, an embodiment of the disclosure will be described in detail with reference to the accompanying drawings.

Figure 2:
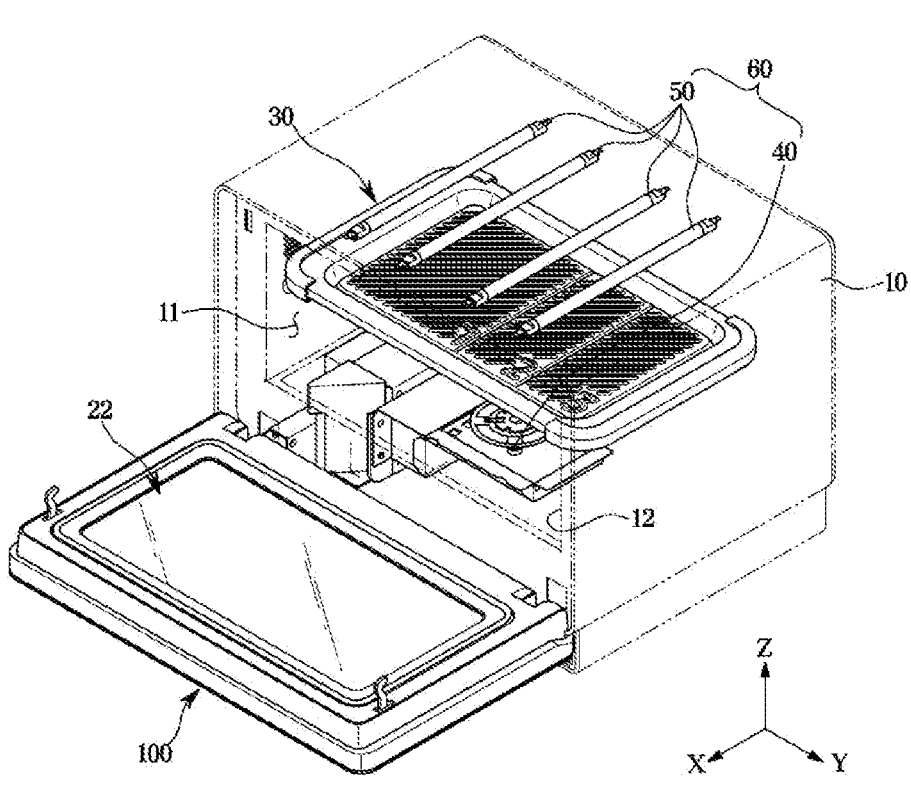
FIG. 2 shows some internal components of the cooking appliance shown in FIG. 1.

FIG. 1 is a perspective view of a cooking appliance according to an embodiment of the disclosure. FIG. 2 shows some internal components of the cooking appliance shown in FIG. 1.

Referring to FIGS. 1 and 2, a cooking appliance 1 may include a first housing 10 forming an exterior of the cooking appliance 1, a second housing 12 positioned inside the first housing 10 and forming a cooking room 11, and the cooking room 11 provided inside the second housing 12, wherein a to-be-cooked material is put in the cooking room 11. The first housing 10 may be an external housing, and the second housing 12 may be an internal housing. The first housing 10 and the second housing 12 may form a main body 2 of the cooking appliance 1.

A certain separation space may be formed between the first housing 10 and the second housing 12.

The cooking room 11 may be substantially in a shape of a rectangular parallelepiped having a long side in a left-right direction Y.

The first housing 10 and the second housing 12 may open toward a front direction of the cooking appliance 1. A user may position a to-be-cooked material in the cooking room 11 through an opening of the second housing 12.

The cooking appliance 1 may include a machine room formed inside the first housing 10 and positioned below the cooking room 11. Various electronic components for driving the cooking appliance 1 may be positioned inside the machine room.

The cooking appliance 1 may include a shelf 30 that is put inside the cooking room 11 to allow the user to position a to-be-cooked material thereon. The shelf 30 may be detachably positioned inside the cooking room 11.

The cooking room 11 may include a supporter formed at both sides of the cooking room 11 to hold the shelf 30 between a top and a bottom of the cooking room 11. A plurality of supporters may be provided along an up-down direction Z to hold the shelf 30 at various heights. Meanwhile, the up-down direction Z may also be referred to as a vertical direction, and in this case, the left-right direction Z may be referred to as a horizontal direction.

The cooking appliance 1 may include a heating source 60 for supplying heat to inside of the cooking room 11 to cook a to-be-cooked material with heat.

The heating source 60 may supply heat to a to-be-cooked material put on the shelf 30 to cook the to-be-cooked material. Also, a to-be-cooked material may be put on the bottom of the cooking room 11 from which the shelf 30 is removed, and in this case, likewise, the heating source 60 may heat the to-be-cooked material put on the bottom of the cooking room 11.

The heating source 60 may include a first heating source 50 positioned above the cooking room 11.

The heating source 60 may include a second heating source 40 positioned below the cooking room 11.

The first heating source 50 may include a plurality of heaters for generating radiant heat. The plurality of heaters may transfer heat directly to the to-be-cooked material by radiating heat generated by themselves.

The second heating source 40 may include a magnetron for generating high frequency. The high frequency generated by the magnetron may be irradiated to inside of a to-be-cooked material to cook the inside of the to-be-cooked material with intermolecular friction heat generated by repeatedly converting a molecular arrangement of water contained in the to-be-cooked material.

The second heating source 40 may be positioned inside the machine room. The second heating source 40 may cause high frequency to oscillate from the machine room toward the bottom of the cooking room 11, and the high frequency may pass through the bottom of the cooking room 11 to be irradiated to the shelf 30, although is not limited thereto.

However, to heat a to-be-cooked material, the first heating source 50 and the second heating source 40 may include a heating source using a different heating method from the heater or the magnetron. The cooking appliance 1 may include a third heating source including a different heating source from a heater or a magnetron.

Figure 3:
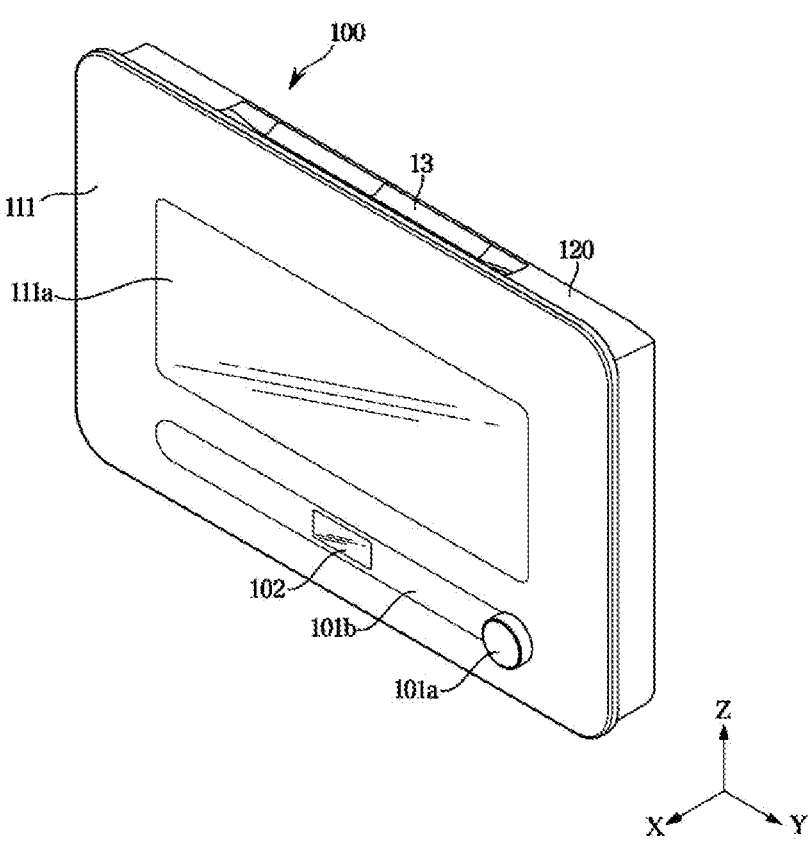
FIG. 3 is a perspective view of a door of the cooking appliance shown in FIG. 1.
Figure 4:
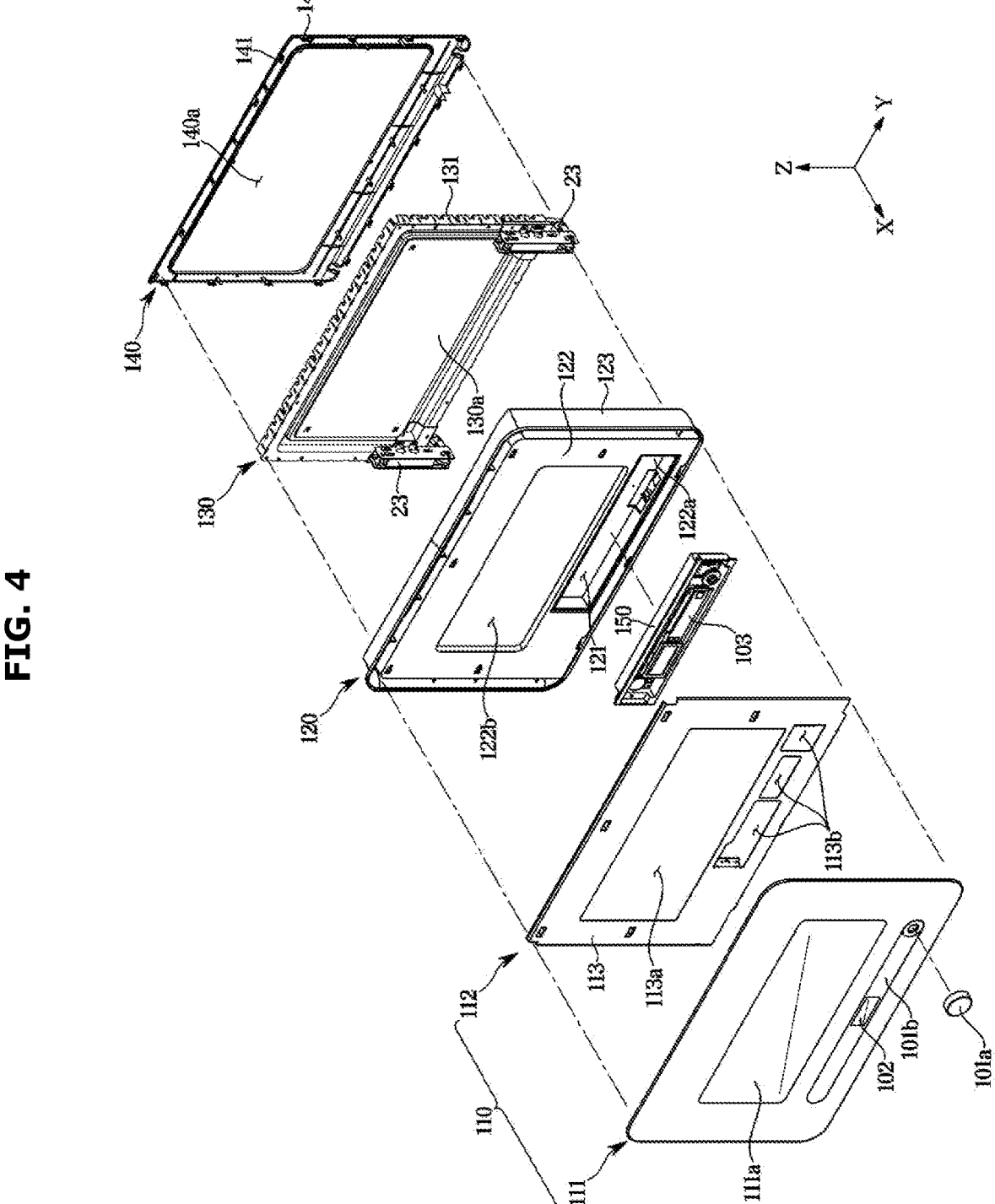
FIG. 4 is an exploded perspective view of the door shown in FIG. 3.
Figure 5:
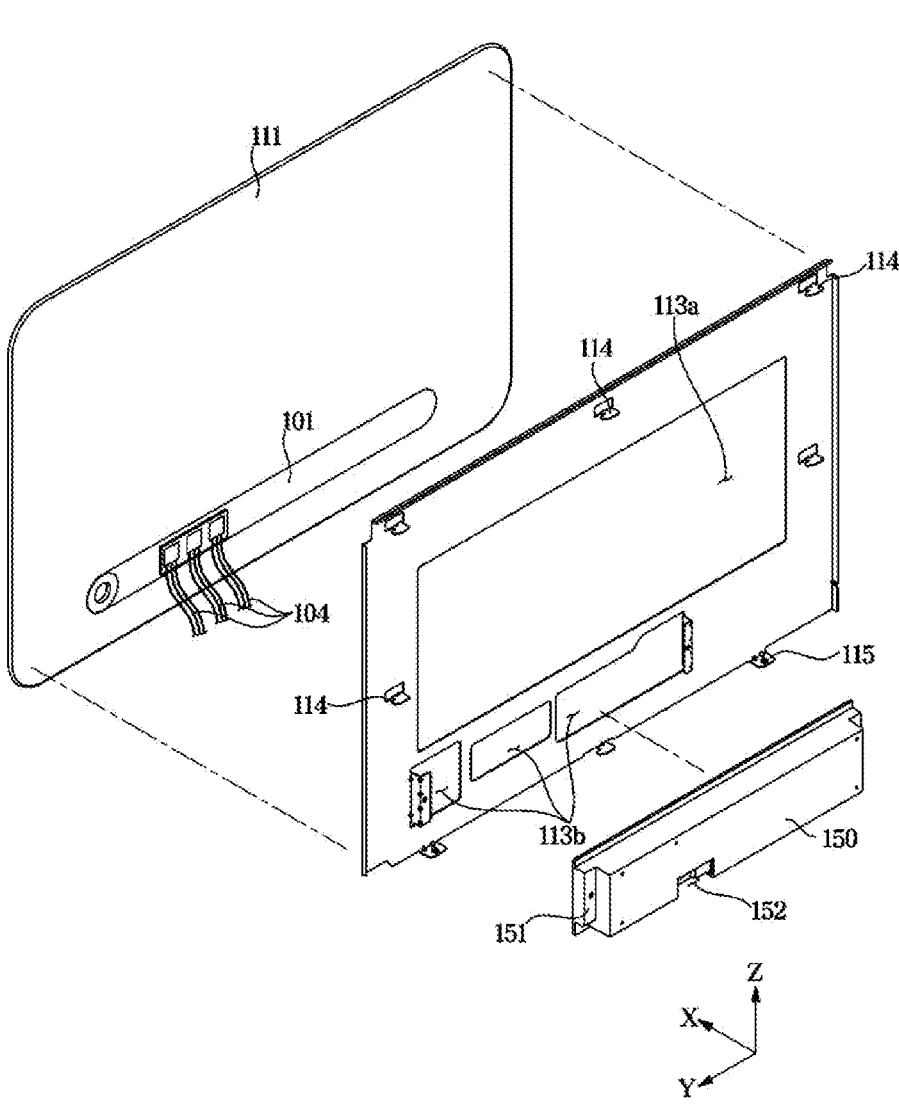
FIG. 5 is an exploded perspective view of a door panel and a board case shown in FIG. 4.
Figure 6:
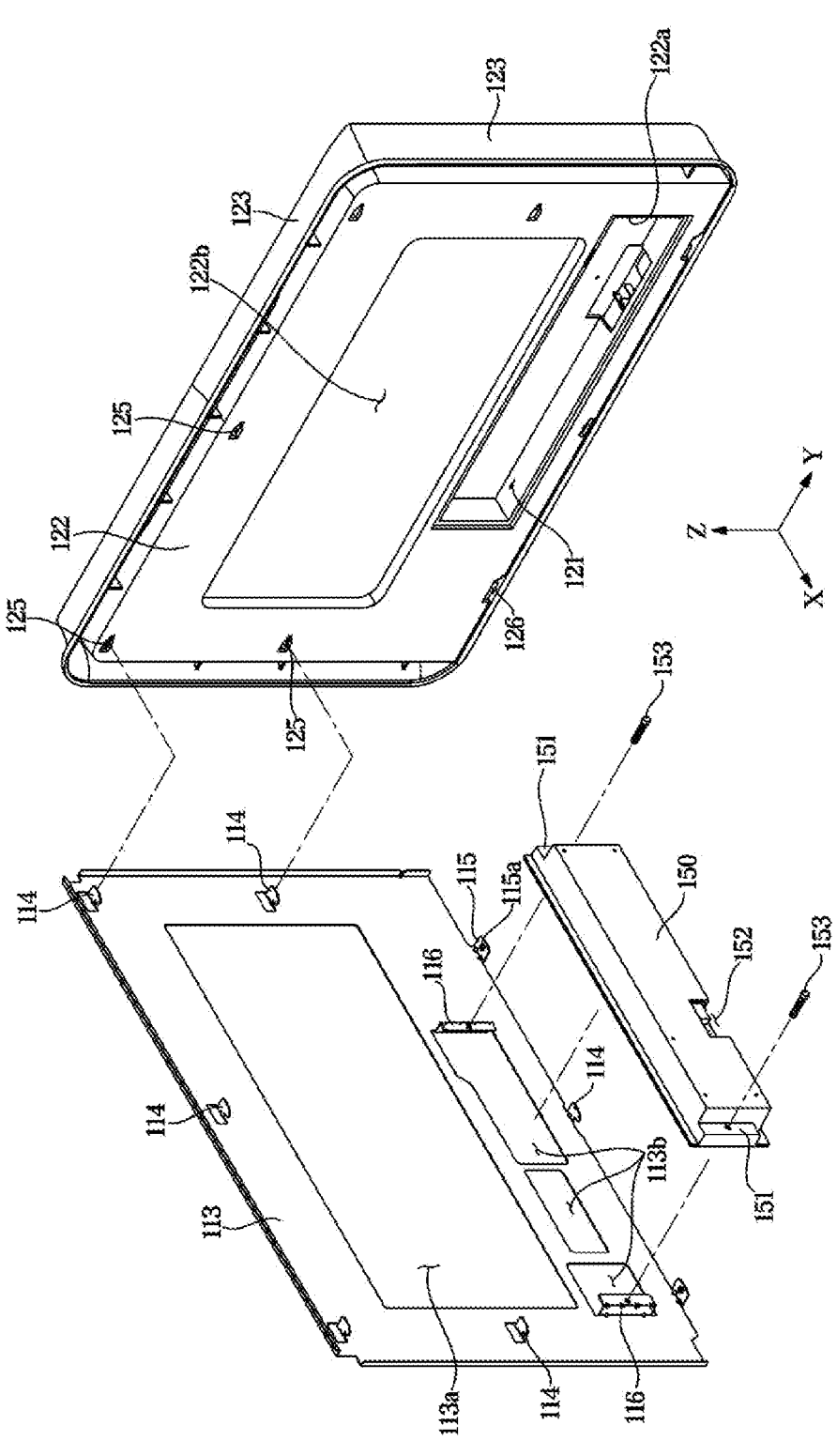
FIG. 6 is an exploded perspective view of a panel bracket and a door body shown in FIG. 4.
Figure 7:
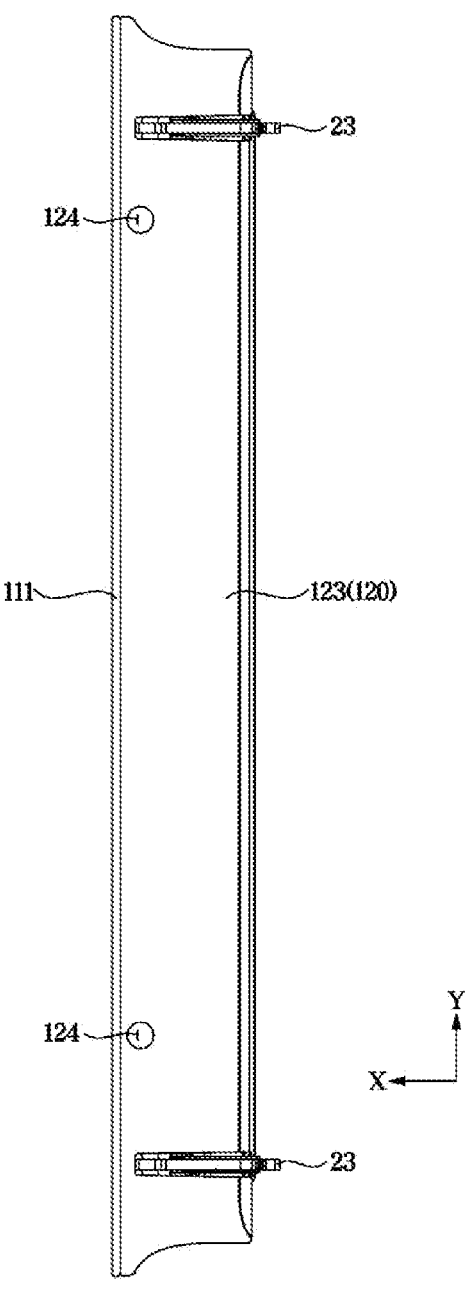
FIG. 7 shows a bottom of the door of FIG. 3, seen from below.
Figure 8:
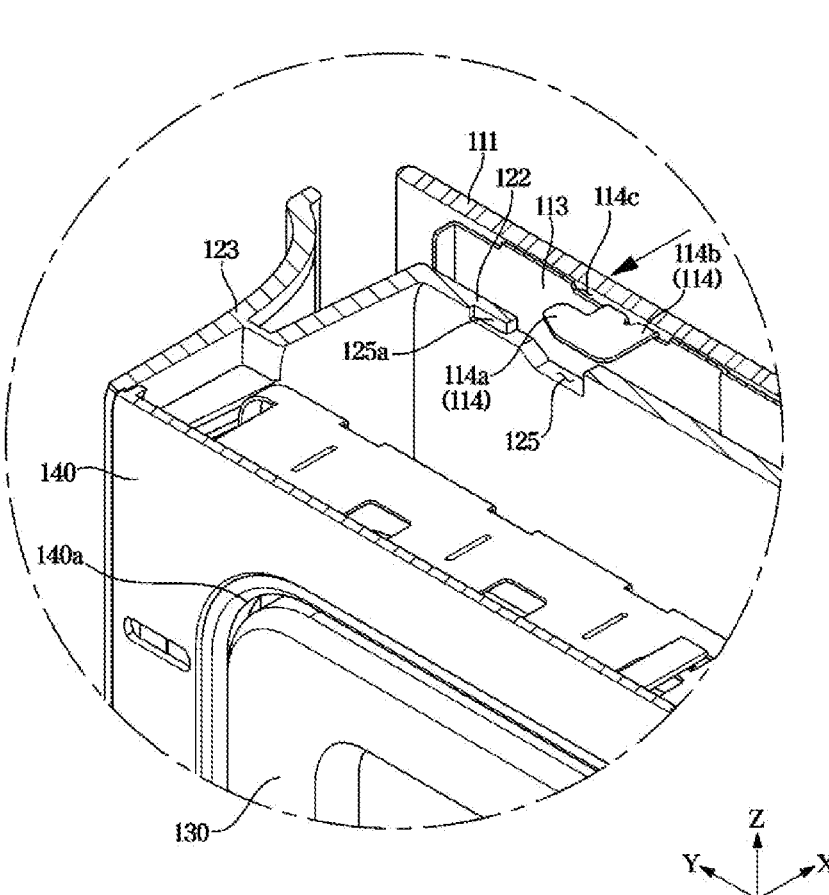
FIG. 8 shows a state in which a door panel moves toward a door body in a first direction in the door shown in FIG. 3.

FIG. 3 is a perspective view of the door 100 of the cooking appliance 1 shown in FIG. 1. FIG. 4 is an exploded perspective view of the door 100 shown in FIG. 3. FIG. 5 is an exploded perspective view of a door panel 110 and a board case 150 shown in FIG. 4. FIG. 6 is an exploded perspective view of a panel bracket 112 and a door body 120 shown in FIG. 4. FIG. 7 shows a bottom of the door 100 of FIG. 3, seen from below. FIG. 8 shows a state in which the door panel 110 moves toward the door body 120 in a first direction in the door 100 shown in FIG. 3.

Referring to FIGS. 3 to 8, the cooking appliance 1 may include a door 100 for opening or closing the openings of the first housing 10 and the second housing 12. In other words, the door 100 may open or close the cooking room 11.

The door 100 may include a hinge 23 provided in a lower end of the door 100 and protruding in a rear direction, and the hinge 23 may be coupled with the first housing 10 or the second housing 12. Accordingly, a lower portion of the door 100 may be rotatably coupled with the main body 2, and according to a rotation of a front side of the door 100 toward a down direction, the openings of the first housing 10 and the second housing 12 may open, and according to a rotation of the front side of the door 100 toward a front direction, the openings of the first housing 10 and the second housing 12 may be closed.

The door 100 may include a see-through window 22 for enabling a user to observe the inside of the cooking room 11 upon closing of the cooking room 11 by the door 100. The see-through window 22 may be configured with a see-through member including a plastic or glass material. The see-through window 22 may be formed by stacking several layers of see-through members, although is not limited thereto.

The door 100 may include an input 101 for enabling a user to input a signal for controlling the cooking appliance 1. The input 101 may include a dial input 101a for enabling a user to input a signal by rotating a dial, and a touch input 101b for enabling a user to input a signal by a touch operation. The dial input 101a and the touch input 101b may use technology generally used in the related art. The input 101 may be provided on the door panel 110.

The door 100 may include a display 102 for displaying an image. The touch input 101b may be provided separately from the display 102. The touch input 101b and the display 102 may be integrated into a single body. In this case, a user may input a signal by touching an image displayed on the display 102.

The door 100 may include a printed circuit board 103 on which a plurality of electronic components are mounted and that controls the input 101 and the display 102. A printed circuit board 103 may control the entirety or a part of various electronic components for driving the cooking appliance 1. The printed circuit board 103 may be positioned in an accommodating space 121 formed inside the door 100.

The door 100 may include a door panel 110 forming a front surface of the door 100, a door body 120 forming a top, a bottom, and left and right sides of the door 100, a choke frame 130 inserted in the door body 120 from behind the door body 120 to be accommodated in the door body 120, and an edge frame 140 positioned behind the door body 120 and coupled with upper, lower, left, and right edges of the door body 120 to form a portion of a rear surface of the door 100.

The door body 120 may include a plate portion 122 forming the front surface of the door body 120, and a flange portion 123 positioned on upper, lower, left, and right edges of the plate portion 122. The flange portion 123 may form the top, bottom, and left and right sides of the door 100. In the flange portion 123 forming the top of the door 100, a handle 13 of the door 100 may be formed.

In a substantial center of the plate portion 122, an incision window 122b may be formed as an opening. The incision window 122b may constitute the see-through window 22, although is not limited thereto. The incision window 122b may be filled with a see-through member formed of a transparent or translucent material, such as glass, plastic, etc., and in a case in which the see-through window 22 is omitted, the incision window 122b may be omitted such that the plate portion 122 has a flat plate shape.

The door body 120 may include at least one coupling hole 125 and at least one coupling groove 126 that are formed in the plate portion 122 in such a way as to penetrate the plate portion 122 and through which the door panel 110 is coupled with the door body 120.

The door body 120 may include a recess 122a formed by depressing the plate portion 122 and opening toward the front direction, and forming the accommodating space 121 in which the printed circuit board 103 is accommodated.

The door 100 may include the choke frame 130 accommodated in an inside space of the door body 120, the inside space formed by the plate portion 122 and the flange portion 123 surrounding the inside space, to prevent high frequency supplied to the cooking room 11 from leaking to outside.

The choke frame 130 may be substantially in a shape of a rectangle as seen in a front-rear direction X, and at upper, lower, left, and right edges of the choke frame 130, a choke structure 131 may be formed to prevent high frequency supplied to an inside space of the cooking room 11 from leaking to an outside space.

In a substantial center of the choke frame 130, a see-through portion 130a constituting the see-through window 22 may be formed. The see-through portion 130a may be formed of a transparent or translucent material, such as glass, plastic, etc. The hinge 23 of the door 100 may be fixed to the choke frame 130.

The second heating source 40 for generating high frequency may be omitted from the cooking appliance 1, and in this case, the choke frame 130 may be omitted.

The door 100 may include the edge frame 140 positioned behind the door body 120 and coupled with the door body 120. Specifically, the edge frame 140 may be coupled with the flange portion 123 of the door body 120. More specifically, a plurality of hooks 123a (see FIG. 11) may protrude from an inner surface of the flange portion 123, and hook grooves 141 corresponding to the hooks 123a of the flange portion 123 may be formed at edges of the edge frame 140. According to hook-coupling of the hooks 123a with the hook grooves 141, the edge frame 140 may be coupled with the door body 120.

In a substantial center of the edge frame 140, an incision window 140a constituting the see-through window 22 and may be formed as an opening. A portion of the choke frame 130 including the see-through portion 130a may be positioned on an inner side of the incision window 140a, although is not limited thereto. The edge frame 140 may be in a shape of a plate from which the incision window 140a is omitted, and the incision window 140a may be filled with a see-through member formed of a transparent or translucent material, such as glass, plastic, etc.

The door 100 may include the door panel 110 forming the front surface of the door 100, covering the accommodating space 121 in which the printed circuit board 103 is accommodated, and including the input 101. The door panel 110 may be positioned in front of the door body 120 and detachably coupled with the door body 120.

The door panel 110 may include a front panel 111 forming a front appearance of the door 100, and a panel bracket 112 detachably coupling the front panel 111 with the door body 120.

The front panel 111 may form an exterior of the door 100, and be in a shape of a flat plate. On a front surface of the front panel 111, various designs for satisfying a user's needs may be provided. The dial input 101a and the touch input 101b may be formed on the front surface of the front panel 111. A connector 104 for transferring a signal of the input 101 to the printed circuit board 103 may be fixed on a rear surface of the front panel 111. The input 101 may be electrically connected with the printed circuit board 103 by the connector 104. The input 101 may include the connector 104.

In a substantial center of the front panel 111, a see-through portion 111a constituting the see-through window 22 and formed of a transparent or translucent material including glass, plastic, etc. may be formed. The see-through portion 111a may be integrated into a portion of the front panel 111, not the see-through portion 111a, although is not limited thereto. However, the see-through portion 111a may be omitted.

The panel bracket 112 may include a bracket body 113 formed in a shape of a thin plate having an outer boundary of a substantially rectangular shape, and a coupling protrusion 114 protruding from the bracket body 113 and detachably coupled with the door body 120. The coupling protrusion 114 may be formed by cutting the bracket body 113 to form a piece of which an end is connected with the bracket body 113 and then bending the piece cut from the bracket body 113 toward the rear direction. The coupling protrusion 114 may be hook-coupled with the door body 120.

The panel bracket 112 may be fixed to the rear surface of the front panel 111. More specifically, the bracket body 113 may be attached to the rear surface of the front panel 111 by a silicon adhesive, etc., although is not limited thereto. However, various methods, such as screw coupling, welding, etc., may be used to fix the bracket body 113 to the rear surface of the front panel 111.

The panel bracket 112 may include an incision window 113a formed in a substantial center of the bracket body 113 and formed as an opening. The incision window 113a may constitute the see-through window 22, although is not limited thereto. The incision window 113a may be filled with a see-through member formed of a transparent or translucent member, such as glass, plastic, etc.

The coupling protrusion 114 may protrude from the rear surface of the bracket body 113 toward the door body 120. The first direction may be a direction in which the coupling protrusion 114 protrudes from the rear surface of the bracket body 113, and the first direction may correspond to a direction toward the rear direction on an X axis extending in the front-rear direction. That is, the coupling protrusion 114 may protrude from the rear surface of the bracket body 113 toward the rear direction.

The coupling protrusion 114 may include a protrusion portion 114a protruding from the rear surface of the bracket body 113 in the first direction, and a hook portion 114b extending from one end of the protrusion portion 114a in a second direction that is perpendicular to the first direction.

The coupling protrusion 114 may include a separation space 114*c* formed between the hook portion 114*b* and the bracket body 113 or between the hook portion 114*b* and the front panel 111. In other words, the separation space 114*c* may be formed by the coupling protrusion 114.

The second direction in which the hook portion 114*b* of the panel bracket 112 shown in FIGS. 1 to 8 extends may correspond to a direction toward a right direction of the door 100 as seen in the front direction, although is not limited thereto. For example, the second direction may correspond to a direction toward a left direction of the door 100 as seen in the front direction. As another example, the second direction may correspond to a direction toward an up direction of the door 100 as seen in the front direction, or a direction toward a down direction of the door 100 as seen in the front direction. In other words, the direction in which the hook portion 114*b* extends may be parallel to a Y axis or a Z axis.

The coupling protrusion 114 may be inserted in the coupling hole 125 of the door body 120. According to sliding of the door panel 110 with respect to the door body 120 in the second direction in a state in which the coupling protrusion 114 is inserted in the coupling hole 125, the door panel 110 may be coupled with the door body 120. In other words, according to sliding of the door panel 110 with respect to the door body 120 in the direction in which the hook portion 114*b* extends in a state in which the coupling protrusion 114 is inserted in the coupling hole 125, the door panel 110 may be coupled with the door body 120.

Specifically, according to sliding of the panel bracket 112 with respect to the door body 120 in the second direction, the panel bracket 112 may be coupled with the door body 120. According to sliding of the panel bracket 112, the front panel 111 fixed to the panel bracket 112 may slide together with the panel bracket 112.

More specifically, according to sliding of the coupling protrusion 114 inserted in the coupling hole 125 in the second direction, a portion of the plate portion 122 may be inserted in the separation space 114*c* formed by the coupling protrusion 114. The portion of the plate portion 122, which is inserted in the separation space 114*c*, may be referred to as a coupling jaw 125*a*. The coupling jaw 125*a* may form a portion of the coupling hole 125, and be positioned at a location corresponding to the separation space 114*c*. The coupling jaw 125*a* may have a smaller thickness than the other portion of the plate portion 122, although is not limited thereto. However, the thickness of the coupling jaw 125*a* may be equal to or greater than that of the other portion of the plate portion 122. The thickness of the coupling jaw 125*a* may be equal to or smaller than a width of the separation space 114*c*.

As such, according to inserting of the coupling jaw 125*a* in the separation space 114*c* formed by the protrusion portion 114*a* and the hook portion 114*b*, the door panel 110 may be fixed to the door body 120 in such a way as to be not separated from the door body 120 although an external force of pulling the door panel 110 in the front direction is applied. Also, because the coupling protrusion 114 is positioned behind the front panel 111 not to be exposed to the outside upon coupling of the door panel 110 with the door body 120, a simple appearance of the door may be achieved.

The panel bracket 112 may include a coupling flange 115 bent from a lower end of the bracket body 113 toward the rear direction. The coupling flange 115 may include a coupling hole 115*a* through which a coupling member 127 including a screw passes. A plurality of coupling flanges 115 may be provided.

The coupling groove 126 of the door body 120 may be positioned at a location corresponding to the coupling flange 115. Accordingly, upon coupling of the panel bracket 112 with the door body 120, the coupling flange 115 may be inserted in the coupling groove 126.

To enable the coupling flange 115 to slide in the second direction while inserting in the coupling groove 126, the coupling groove 126 may have a greater width than the coupling flange 115. In this case, the width of the coupling groove 126 and the width of the coupling flange 115 may correspond to a length in Y-axis direction of each of the coupling groove 126 and the coupling flange 115 upon a parallel arrangement of the panel bracket 112 and the door body 120. Accordingly, upon inserting of the coupling protrusion 114 into the coupling hole 125, the coupling flange 115 may also be inserted into the coupling groove 126, and according to sliding of the coupling protrusion 114 in the second direction parallel to the Y axis in a state of inserting into the coupling hole 125, the coupling flange 115 may also slide in the second direction in a state of inserting into the coupling groove 126.

Meanwhile, the door body 120 may include a through hole 124 through which a coupling member 127 including a screw passes, and upon sliding of the coupling protrusion 114 in the second direction to be fixed to the coupling jaw 125*a*, the coupling hole 115*a* of the coupling flange 115 may be positioned at a location corresponding to the through hole 124 of the door body 120. The through hole 124 may be formed in the flange portion 123 forming a bottom of the door body 120, corresponding to the bottom of the door 100. The through hole 124 may penetrate the flange portion 123.

According to sliding of the panel bracket 112, the coupling hole 115*a* may face the through hole 124, the coupling member 127 may be coupled with the door body 120 by penetrating the coupling hole 115*a* and the through hole 124, and the coupling member 127 penetrated the coupling hole 115*a* and the through hole 124 may couple the panel bracket 112 with the door body 120. In other words, because the coupling member 127 penetrates the bottom of the door body 120 and the coupling flange 115, the panel bracket 112 may be coupled with the door body 120. The coupling member 127 may include a positioning member including a screw, a pin, etc.

As such, because the through hole 124 and the coupling member 127 are formed in the bottom of the door 100 to be relatively invisible, a simple appearance of the door 100 may be achieved.

So far, a case in which the coupling flange 115, the coupling groove 126, and the through hole 124 are positioned in a lower end portion of the door 100 has been described, although are not limited thereto. For example, the coupling flange 115, the coupling groove 126, and the through hole 124 may be positioned in an upper end portion of the door. In this case, the coupling flange 115 may be bent from an upper end of the bracket body 113 toward the rear direction, and the through hole 124 may be formed in the flange portion 123 forming a top of the door body 120, corresponding to the top of the door 100.

As another example, the second direction in which the hook portion 114*b* extends and the door panel 110 slides may be parallel to the Z axis. In this case, the coupling flange 115 may be bent from one or both side ends of the bracket body 113 toward the rear direction, the through hole 124 may be formed in the flange portion 123 forming the sides of the door body 120, corresponding to the sides of the door 100, and the coupling flange 115 may slide in the second direction in a state of inserting into the corresponding coupling groove 126.

The door 100 may include a board case 150 in which the printed circuit board 103 is positioned and which is accommodated in the recess 122a. The printed circuit board 103 may be accommodated in the accommodating space 121 when positioned inside the board case 150.

The board case 150 may be in a shape of a box having an opening toward the front direction. The printed circuit board 103 may pass through the opening to be positioned inside the board case 150, and the board case 150 in which the printed circuit board 103 is positioned may be accommodated in the accommodating space 121. The board case 150 may perform a heat insulation function of protecting the printed circuit board 103 from heat generated inside the cooking room 11. In a rear portion of the board case 150, an outlet 152 may be formed to take a connector, etc. extending from the printed circuit board 103 positioned inside the board case 150 out of the board case 150.

The board case 150 may be positioned behind the panel bracket 112 and coupled with the panel bracket 112. More specifically, the board case 150 may include a plurality of insertion jaws 151 formed at both sides, and the panel bracket 112 may include a plurality of fixing rails 116 protruding from the rear surface of the bracket body 113 to correspond to the plurality of insertion jaws 151 and supporting the insertion jaws 151.

By causing a coupling member 153 including a screw to penetrate the insertion jaw 151 and the fixing rail 116 in a state in which the insertion jaw 151 is inserted in the fixing rail 116 and be coupled with the panel bracket 112, the board case 150 may be coupled with the panel bracket 112. The coupling member 153 may include a positioning member including a screw, a pin, etc.

Meanwhile, the panel bracket 112 may include an incision portion 113b formed in the bracket body 113 and formed as an opening. The connector 104 attached to the front panel 111 may pass through the incision portion 113b and then be electrically connected with the printed circuit board 103 accommodated inside the board case 150.

The board case 150 may be positioned at a location corresponding to the incision portion 113b. More specifically, the board case 150 may be positioned behind the bracket body 113 such that the entire or a part of the incision portion 113b is positioned inside the opening of the board case 150. The incision portion 113b may be positioned between a pair of fixing rails 116 corresponding to a pair of insertion jaws 151 formed at both sides of the board case 150. A plurality of incision portions 113b may be provided.

The board case 150 may be positioned at a location corresponding to the recess 122a. Accordingly, upon coupling of the door panel 110 coupled with the board case 150 with the door body 120, the board case 150 may be inserted in the recess 122a. A length in left-right direction Y of the recess 122a may be greater than a length in left-right direction Y of the board case 150, and the board case 150 may slide in the second direction together with the door panel 110 in a state of inserting into the recess 122a.

As such, because the board case 150 is fixed to the panel bracket 112, a user may separate the door panel 110 from the door body 120 and take the printed circuit board 103 out of the accommodating space 121 without performing any additional task, which may facilitate a manufacturing process and a repair work, although is not limited thereto.

For example, the board case 150 may be coupled with the door body 120 by a coupling member including a screw, in a state of inserting into the accommodating space 121. The coupling member may include a positioning member including a screw, a pin, etc. The coupling member may be coupled with the door body 120 by penetrating the board case 150. In this case, the fixing rail 116 may be omitted. As another example, the board case 150 and the fixing rail 116 may be omitted. In this case, the printed circuit board 103 may be accommodated directly in the accommodating space 121.

Figure 9:
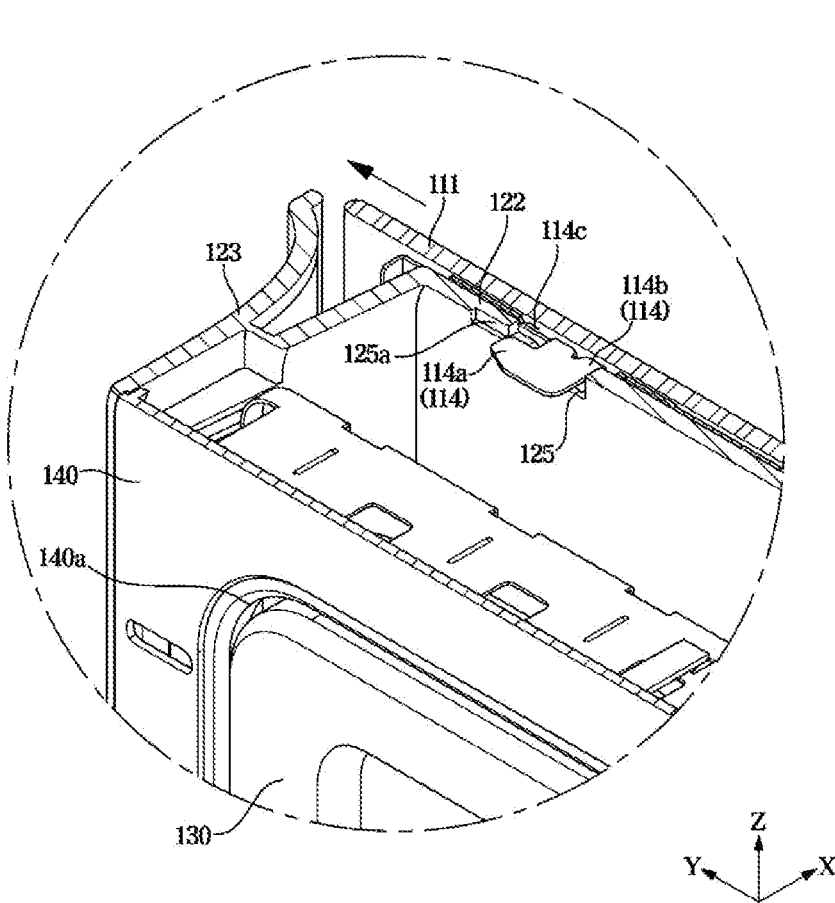
FIG. 9 shows a state in which the door panel is inserted in a coupling hole and then slides in a second direction in the door shown in FIG. 8.
Figure 10:
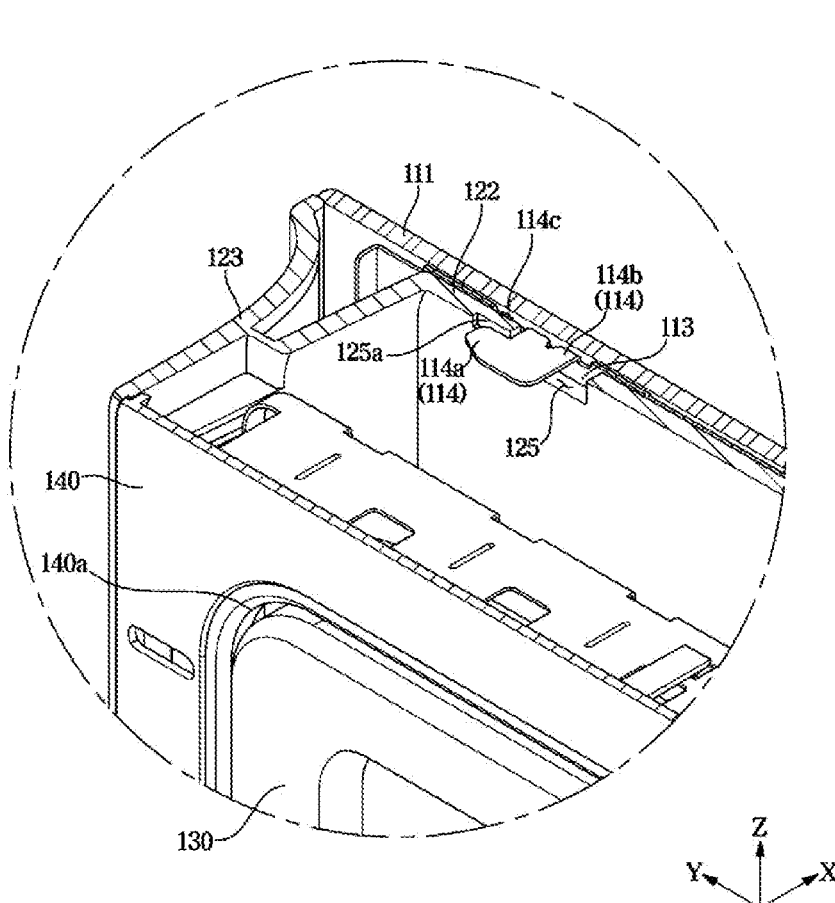
FIG. 10 shows a state in which the door panel slides in the second direction and is coupled with the door body in the door shown in FIG. 9.
Figure 11:
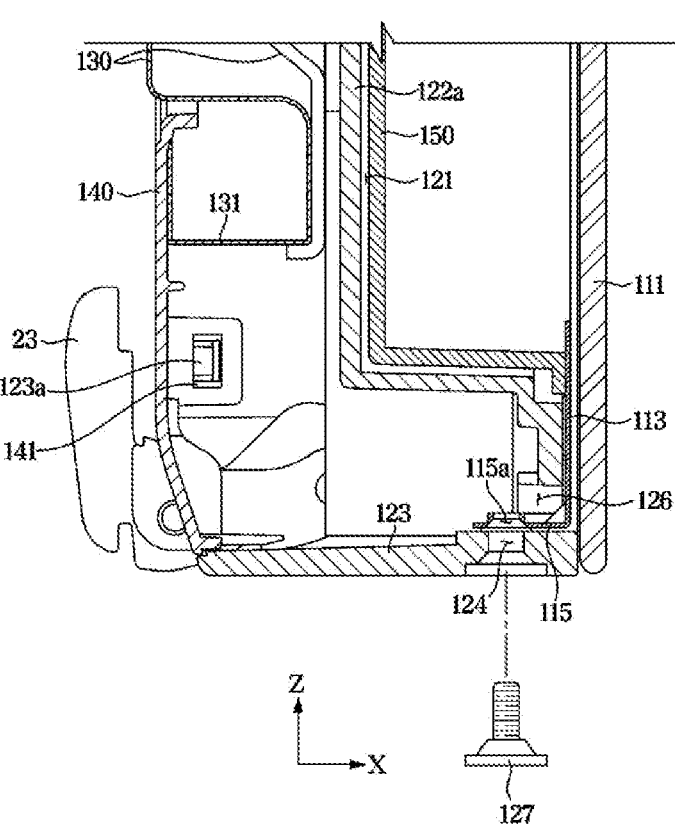
FIG. 11 shows a state in which a coupling member is inserted in a through hole and a coupling hole in the door shown in FIG. 10.

FIG. 9 shows a state in which the door panel 110 is inserted in the coupling hole 125 and then slides in the second direction in the door 100 shown in FIG. 8. FIG. 10 shows a state in which the door panel 110 slides in the second direction and is coupled with the door body 120 in the door shown in FIG. 9. FIG. 11 shows a state in which the coupling member 127 is inserted in the through hole and the coupling hole 125 in the door 100 shown in FIG. 10. In FIG. 11, the printed circuit board 103 is not shown, however, it may be obvious that the printed circuit board 103 is positioned inside the board case 150 shown.

A process of assembling the door panel 110 with the door body 120 and separating the door panel 110 from the door body 120 will be described with reference to FIGS. 8 to 11.

The door panel 110 may be provided in a state in which the board case 150 accommodating the printed circuit board 103 is coupled with the panel bracket 112, although is not limited thereto. However, the board case 150 may be accommodated in the recess 122a without coupling with the panel bracket 112, or the printed circuit board 103 may be positioned inside the recess 122a without the board case 150.

All the case in which the board case 150 is coupled with the panel bracket 112, the case in which the board case 150 is accommodated in the recess 122a without coupling with the panel bracket 112, and the case in which the printed circuit board 103 is positioned in the recess 122a without the board case 150 may be subject to a process for assembling and separating the door panel 110, which will be described below.

The door panel 110 may be arranged in parallel to the door body 120 such that the coupling protrusion 114 and the coupling flange 115 are arranged toward the door body 120. More specifically, the coupling protrusion 114 may be arranged to face the coupling hole 125 of the door body 120, and the coupling flange 115 may be arranged to face the coupling groove 126.

According to moving of the door panel 110 toward the door body 120 by a user, the coupling protrusion 114 may be inserted into the coupling hole 125 and the coupling flange 115 may be inserted into the coupling groove 126. That is, according to moving of the door panel 110 in the first direction, a portion of the door panel 110 may be inserted into the coupling hole 125 and the coupling groove 126.

According to sliding of the door panel 110 with respect to the door body 120 in the second direction in a state in which the coupling protrusion 114 is inserted in the coupling hole 125, the coupling protrusion 114 may be fixed to the coupling jaw 125a, as described above, and the coupling flange 115 and the coupling hole 115a may face the through hole 124 of the door body 120.

The coupling member 127 may penetrate the through hole 124 and the coupling hole 115a to be coupled with the door body 120, and coupling of the door panel 110 with the door body 120 may be completed.

By performing the above-described process reversely, the door panel 110 may be separated from the door body 120.

According to coupling of the door panel 110 with the door body 120, the accommodating space 121 may be covered by the front panel 111, and according to separating of the door panel 110 from the door body 120, the accommodating space 121 may be exposed to the outside of the cooking appliance 1.

Accordingly, the user may easily access the printed circuit board 103 positioned inside the accommodating space 121 by simply separating only the door panel without performing a difficult door disassembling task. Also, in the case in which the board case 150 accommodating the printed circuit board 103 is coupled with the door panel 110, the board case 150 may be taken out of the accommodating space 121 by separating the door panel 110, and accordingly, a task of separating the printed circuit board 103 may be easily performed. Furthermore, the user may easily change a design of the door 100 by changing only the door panel 110 without changing the entire door 100.

Figure 12:
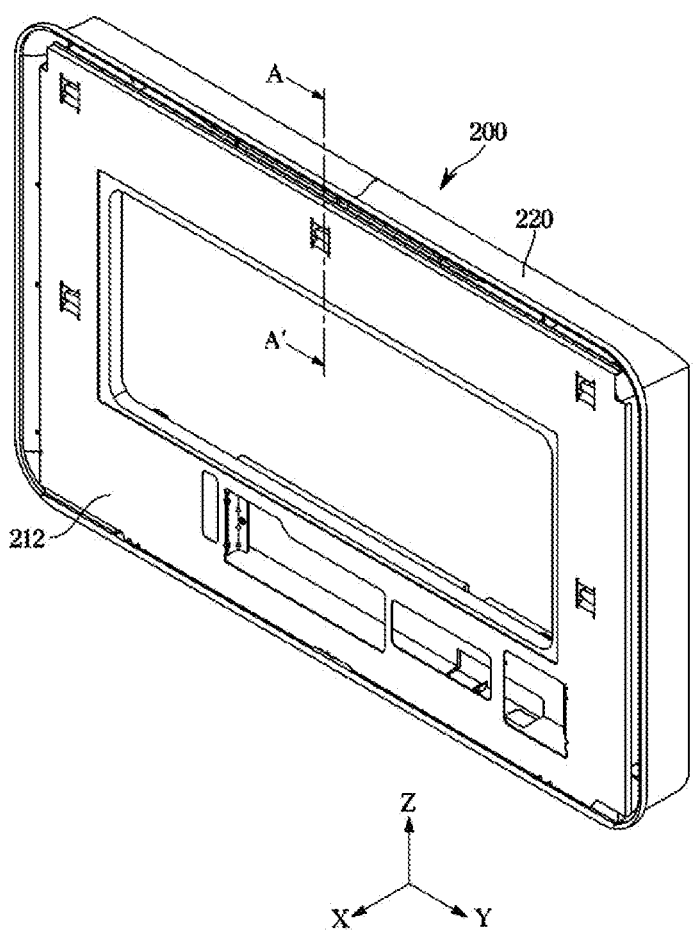
FIG. 12 is a perspective view showing a state in which a door body is coupled with a panel bracket in a cooking appliance according to various embodiments of the disclosure.
Figure 13:
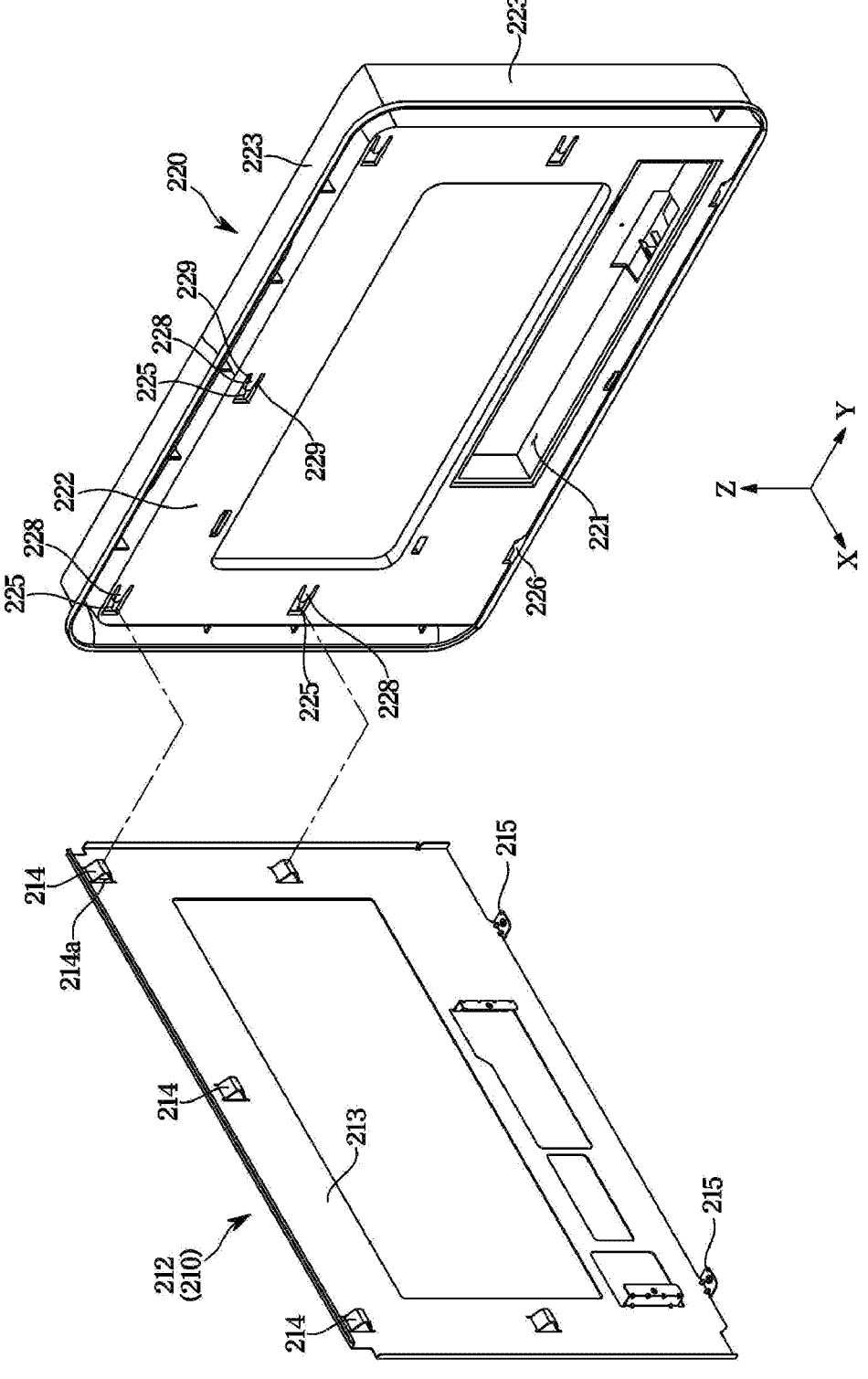
FIG. 13 is an exploded perspective view of the door body and the panel bracket shown in FIG. 12.
Figure 14:
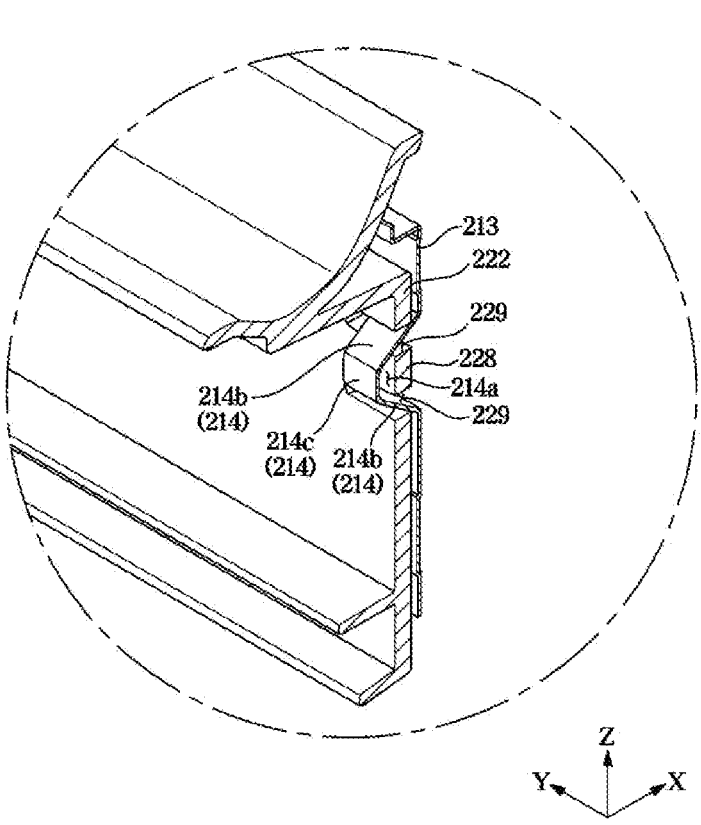
FIG. 14 is a cross-sectional view of the door shown in FIG. 12, taken along line A-A'.

FIG. 12 is a perspective view showing a state in which a door body 220 is coupled with a panel bracket 212 in a cooking appliance according to various embodiments of the disclosure. FIG. 13 is an exploded perspective view of the door body 220 and the panel bracket 212 shown in FIG. 12. FIG. 14 is a cross-sectional view of the door 200 shown in FIG. 12, taken along line A-A'.

Not-mentioned components of door 200 of the cooking appliance shown in FIGS. 12 to 14 may be the same as the corresponding components of the door 100 shown in FIGS. 1 to 11, except that some components including a coupling protrusion 214 and a coupling hole 225 are different from the corresponding ones of the door 100 of the cooking appliance shown in FIGS. 1 to 11. Hereinafter, content overlapping with the above-described content will be omitted.

A coupling protrusion 214 may protrude from a bracket body 213 of a panel bracket 212 in the rear direction. The coupling protrusion 214 may be in a shape of a bent panel. More specifically, the coupling protrusion 214 may include a pair of inclined panel portions 214b inclined with respect to the bracket body 213, wherein one end of each of the pair of inclined panel portions 214b is connected with the bracket body 213, and a flat panel portion 214c connected with the other end of each of the pair of inclined panel portions 214b and spaced from the bracket body 213. The flat panel portion 214c may be parallel to the bracket body 213.

The coupling protrusion 214 may include a coupling space 214a opening in the second direction. More specifically, the coupling space 214a may correspond to a space surrounded by the pair of the inclined panel portions 214b and the flat panel portion 214c.

A door body 220 may include a guide protrusion 228 that corresponds to the coupling space 214a and is inserted in the coupling space 214a. More specifically, a pair of guide grooves 229 connected with the coupling hole 225 may be spaced from each other, and the respective guide grooves 229 may extend from an upper end and a lower end of the coupling hole 225 in such a way as to be parallel to each other in the second direction. In this case, a portion of a plate portion 222, incised by the guide grooves 229 and positioned between the pair of guide grooves 229, may correspond to the guide protrusion 228. That is, the guide protrusion 228 may be formed by the guide grooves 229.

According to moving of the door panel 210 toward the door body 220 by a user, the coupling protrusion 214 may be inserted into the coupling hole 225, and a coupling flange 215 may be inserted into a coupling groove 226. That is, according to a movement of the panel bracket 212 in the first direction, the coupling protrusion 214 may be inserted into the coupling hole 225 and the coupling flange 215 may be inserted into the coupling groove 226.

According to sliding of the panel bracket 212 with respect to the door body 220 in the second direction in a state in which the coupling protrusion 214 is inserted in the coupling hole 225, the guide protrusion 228 of the door body 220 may be inserted into the coupling space 214a, and the coupling protrusion 214 may be inserted into the guide groove 229. More specifically, according to sliding of the panel bracket 212 with respect to the door body 220 in the second direction, each of the pair of inclined panel portions 214b may move in the second direction and be inserted in the corresponding guide groove 229.

A coupling member may be coupled with the door body 220 by penetrating a through hole formed in a flange portion 223 forming a bottom of the door body and a coupling hole formed in the coupling flange 215, and coupling of the door panel 210 with the door body 220 may be completed.

By performing the above-described process reversely, the door panel 210 may be separated from the door body 220.

According to coupling of the door panel 210 with the door body 220, an accommodating space 221 may be covered by a front panel (not shown), and according to separating of the door panel 210 from the door body 220, the accommodating space 221 may be exposed to the outside.

Accordingly, the user may easily access a printed circuit board positioned inside the accommodating space by simply separating only the door panel without performing a difficult door disassembling task. Also, in the case in which a board case accommodating the printed circuit board is coupled with the door panel, the board case may be taken out of the accommodating space by separating the door panel, and accordingly, a task of separating the printed circuit board may be easily performed. Furthermore, the user may easily change a design of the door by changing only the door panel without changing the entire door.

Although the present disclosure has been described with various embodiments, various changes and modifications may be suggested to one skilled in the art. It is intended that the present disclosure encompass such changes and modifications as fall within the scope of the appended claims.

What is claimed is:

1. A cooking appliance comprising:
a cooking room; and
a door configured to open or close the cooking room,
wherein the door comprises:
a door body forming an accommodating space in which a printed circuit board is accommodated;
a front panel positioned in front of the door body to cover the accommodating space; and
a panel bracket fixed to the front panel and configured to detachably couple the front panel with the door body, the panel bracket including a fixing rail to support a board case and an incision portion for penetration by a connector, and
wherein the accommodating space is exposed to an outside of the cooking appliance upon separating of the front panel from the door body.

2. The cooking appliance of claim 1, wherein:
the panel bracket comprises:
a bracket body fixed to a rear surface of the front panel; and
a coupling protrusion protruding from the bracket body and coupled with the door body, and
the door body comprises a coupling hole in which the coupling protrusion is inserted.

3. The cooking appliance of claim 2, wherein:
the coupling protrusion is inserted in the coupling hole in a first direction, and the coupling protrusion inserted in the coupling hole is coupled with the door body by sliding in a second direction that is perpendicular to the first direction.

4. The cooking appliance of claim 3, wherein the coupling protrusion comprises:

a protrusion portion protruding from the bracket body in the first direction; and a hook portion extending from one end of the protrusion portion in the second direction.

5. The cooking appliance of claim 4, wherein:

the door body comprises a coupling jaw forming a portion of the coupling hole, and according to sliding of the coupling protrusion, the coupling jaw is inserted in a separation space formed by the coupling protrusion.

6. The cooking appliance of claim 3, wherein the coupling protrusion is in a shape of a bent panel, and forms a coupling space opening in the second direction.

7. The cooking appliance of claim 6, wherein:

the door body comprises a guide protrusion corresponding to the coupling space and formed between a pair of guide grooves extending from the coupling hole, and according to sliding of the coupling protrusion, the guide protrusion is configured to insert in the coupling space and the coupling protrusion is configured to insert in the pair of guide grooves.

8. The cooking appliance of claim 2, wherein:

the panel bracket comprises a coupling flange bent from a lower end, and the door body comprises a coupling groove that corresponds to the coupling flange and in which the coupling flange is inserted.

9. The cooking appliance of claim 8, wherein the panel bracket is coupled with the door body by a coupling member penetrating a bottom of the door body and the coupling flange.

10. The cooking appliance of claim 2, wherein:

the door body comprises a recess opening toward the front direction and forming the accommodating space, and the door further comprises the board case accommodated in the recess and configured to receive the printed circuit board.

11. The cooking appliance of claim 10, wherein the board case is fixed to the panel bracket by a coupling member, and upon coupling of the panel bracket with the door body, the board case is accommodated in the recess.

12. The cooking appliance of claim 11, wherein:

the fixing rail protrudes from a rear surface of the bracket body to support a side portion of the board case, and the coupling member is coupled with the board case by penetrating the fixing rail.

13. The cooking appliance of claim 10, wherein the board case is fixed to the door body by a coupling member, in a state of inserting into the recess.

14. The cooking appliance of claim 10, wherein the front panel comprises an input electrically connected with the printed circuit board.

15. The cooking appliance of claim 14, wherein:

the input is electrically connected with the printed circuit board by the connector, the incision portion is penetrated by the connector, and the board case is positioned at a location corresponding to the incision portion.

16. A cooking appliance including:

a housing;

a door body rotatably coupled with the housing;

a front panel positioned in front of the door body and forming a front of the cooking appliance; and a panel bracket having a first side fixed to the front panel and configured to detachably couple the front panel with the door body and a second side configured to hook-couple with the door body, the panel bracket including a fixing rail to support a board case and an incision portion for penetration by a connector.

17. The cooking appliance of claim 16, wherein the panel bracket includes a coupling protrusion coupled with the door body and including:

a protrusion portion protruding toward the door body, and a hook portion bent from an end of the protrusion portion in a horizontal direction.

18. The cooking appliance of claim 16, wherein:

the panel bracket is configured to slide in a horizontal direction with respect to the door body, and the front panel is configured to slide together with the panel bracket.

19. The cooking appliance of claim 16, further includes:

the board case installed in the door body, which opens towards the front panel, and is configured to accommodate a printed circuit board.

20. The cooking appliance of claim 19, wherein the front panel is configured to cover the board case in a front direction.

* * * * *